(12) United States Patent
Sohn et al.

(10) Patent No.: US 12,512,844 B2
(45) Date of Patent: Dec. 30, 2025

(54) VOLTAGE-CURRENT CONVERSION CIRCUIT, A VOLTAGE-CONTROLLED OSCILLATOR, AND A PHASE-LOCKED LOOP CIRCUIT

(71) Applicant: LX SEMICON CO., LTD., Daejeon (KR)

(72) Inventors: Ji Hoon Sohn, Daejeon (KR); Yong Hwan Moon, Daejeon (KR); Jae Wook Yoo, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 3 days.

(21) Appl. No.: 18/585,176

(22) Filed: Feb. 23, 2024

(65) Prior Publication Data

US 2024/0291494 A1   Aug. 29, 2024

(30) Foreign Application Priority Data

Feb. 23, 2023   (KR) .......................... 10-2023-0024209

(51) Int. Cl.
*H03L 7/099*   (2006.01)
*H03L 7/093*   (2006.01)

(52) U.S. Cl.
CPC ............ *H03L 7/0995* (2013.01); *H03L 7/093* (2013.01)

(58) Field of Classification Search
CPC .............................. H03L 7/099; H03L 7/0995
See application file for complete search history.

(56) References Cited

U.S. PATENT DOCUMENTS

| 7,474,130 B1 | 1/2009 | Lo et al. |
| 10,985,767 B2* | 4/2021 | Chen ....................... H03L 7/099 |
| 2009/0079470 A1 | 3/2009 | Bi |

FOREIGN PATENT DOCUMENTS

EP   3487076 A1   5/2019

OTHER PUBLICATIONS

Extended European Search Report issued for European Patent Application No. 24157837.6 on Jul. 15, 2024, 8 page.

* cited by examiner

*Primary Examiner* — Diana J. Cheng
(74) *Attorney, Agent, or Firm* — ROTHWELL, FIGG, ERNST & MANBECK, P.C.

(57) ABSTRACT

The voltage-controlled oscillator can include a voltage-current conversion circuit that outputs a control current corresponding to the control voltage, and a ring oscillator that generates an output signal with a frequency corresponding to the control current. According to an embodiment, by using a voltage-current conversion circuit, it is possible to design a voltage-controlled oscillator that can operate even with a relatively low supply power and have stable characteristics even when the temperature changes.

14 Claims, 6 Drawing Sheets

VOLTAGE-CURRENT CONVERSION CIRCUIT, A VOLTAGE-CONTROLLED OSCILLATOR, AND A PHASE-LOCKED LOOP CIRCUIT

CROSS REFERENCE TO RELATED APPLICATION(S)

This application claims the benefit of Korean Patent Application No. 10-2023-0024209, filed on Feb. 23, 2023, which is hereby incorporated by reference in its entirety as if fully set forth herein.

BACKGROUND OF THE DISCLOSURE

Field

Embodiments relate to a voltage-current conversion circuit, a voltage-controlled oscillator, and a phase-locked loop circuit.

Discussion of the Related Art

An electronic device can comprise a voltage-controlled oscillator (VCO) that varies the frequency of an output signal using an input voltage. For example, the voltage-controlled oscillator can output a signal with a frequency corresponding to the input voltage or input current. For example, an oscillator built into the electronic device can generate a clock signal corresponding to a preset frequency, and the electronic device can operate based on the clock signal of the oscillator. The oscillators must generate accurate and stable clock signal for the reliability of the electronic device.

The oscillator can be implemented as a ring oscillator. For example, a ring oscillator can comprise a plurality of inverters connected to each other in a loop shape. In the ring oscillator, the frequency of the output signal can be controlled using the input current. Therefore, the control voltage for controlling the oscillator can be converted into a control current to control the ring oscillator and then input to the ring oscillator. A voltage-current conversion circuit can be added to the front end of the ring oscillator to convert the control voltage into a control current.

The voltage-current conversion circuit can be implemented in various ways. When the voltage-current conversion circuit is configured as a differential structure, there is a disadvantage that it is difficult to use the voltage-current conversion circuit at a relatively low supply power because an operating voltage is required in a region where the current source is saturated. When the voltage-current conversion circuit is composed of a single structure, a threshold voltage of an input transistor through which the control voltage is input can change according to changes in temperature. There is a disadvantage that the compliance range of the voltage-current conversion circuit changes depending on the change in the threshold voltage of the input transistor.

Therefore, there is a need to develop a technology that can output a signal with a stable frequency from a ring oscillator by consistently outputting a control current corresponding to the control voltage regardless of changes in temperature.

SUMMARY OF THE DISCLOSURE

The embodiment aims to solve the above-mentioned problems and other problems.

Another purpose of the embodiment is to provide a voltage-current conversion circuit, a voltage-controlled oscillator, and a phase-locked loop circuit that can operate at a relatively low supply power and have constant characteristics even when temperature changes.

According to one aspect of the embodiment to achieve the above or other objects, a voltage-controlled oscillator, comprising: a voltage-current conversion circuit configured to receive a control voltage and output a control current corresponding to the control voltage; and a ring oscillator configured to output an output signal with a frequency corresponding to the control current, wherein the voltage-current conversion circuit comprises: a first circuit configured to output a first current corresponding to the control voltage; a second circuit configured to output a second current corresponding to a reference voltage; and a third circuit configured to output the control current based on the first current and the second current.

The second circuit can be a replica circuit of the first circuit.

The third circuit can form a current mirror with the second circuit to output a third current corresponding to the second current, and output the control current based on the first current and the third current.

The control current can be generated based on the difference between the first current and the third current.

The reference voltage can be a preset voltage.

The first circuit can comprise a first NMOS transistor having a gate terminal through which the control voltage is input, and the second circuit can comprise a second NMOS transistor having a gate terminal through which the reference voltage is input.

The first NMOS transistor and the second NMOS transistor can have the same temperature characteristics.

According to another aspect of the embodiment to achieve the above or other purposes, a voltage-current conversion circuit, comprising: a first circuit configured to receive a control voltage and output a first current corresponding to the control voltage; a second circuit configured to receive a reference voltage and output a second current corresponding to the reference voltage; and a third circuit configured to output a control current corresponding to the control voltage based on the first current and the second current.

The second circuit can be a replica circuit of the first circuit.

The third circuit can form a current mirror with the second circuit to output a third current corresponding to the second current, and output the control current based on the first current and the third current.

The control current can be generated based on the difference between the first current and the third current.

The reference voltage can be a preset voltage.

The first circuit can comprise a first NMOS transistor having a gate terminal through which the control voltage is input, and the second circuit can comprise a second NMOS transistor having a gate terminal through which the reference voltage is input.

The first NMOS transistor and the second NMOS transistor have the same temperature characteristics.

According to another aspect of the embodiment to achieve the above or other objects, a phase-locked loop circuit, comprising: a phase detector configured to detect a phase difference between a first input signal and a second input signal; a filter configured to charge or discharge based on the phase difference; a voltage-current conversion circuit configured to output a control current corresponding to a control voltage applied to the filter; and an oscillator configured to output an output signal with a frequency corresponding to the control current, wherein the voltage-current conversion circuit comprises: a first circuit configured to output a first current corresponding to the control voltage; a second circuit configured to output a second current corresponding to a reference voltage; and a third circuit configured to output the control current based on the first current and the second current.

The second circuit can be a replica circuit of the first circuit.

The third circuit can form a current mirror with the second circuit to output a third current corresponding to the second current, and output the control current based on the first current and the third current.

The control current can be generated based on the difference between the first current and
the third current.

The second input signal can correspond to the output signal of the oscillator.

The oscillator can comprise a ring oscillator.

The effects of the voltage-current conversion circuit, the voltage-controlled oscillator, and the phase-locked loop circuit according to the embodiment are described as follows.

According to an embodiment, by using a voltage-current conversion circuit, it is possible to design a voltage-controlled oscillator that can operate even with a relatively low supply power and have stable characteristics even when the temperature changes.

According to the embodiment, since it has a current output through a replica circuit that constitutes a voltage-current conversion circuit, it is suitable for implementing a current mirror and can have high scalability. Accordingly, the voltage-current conversion circuit can be easily configured as a multi-lane circuit.

DETAILED DESCRIPTION OF EMBODIMENTS

Figure 1:
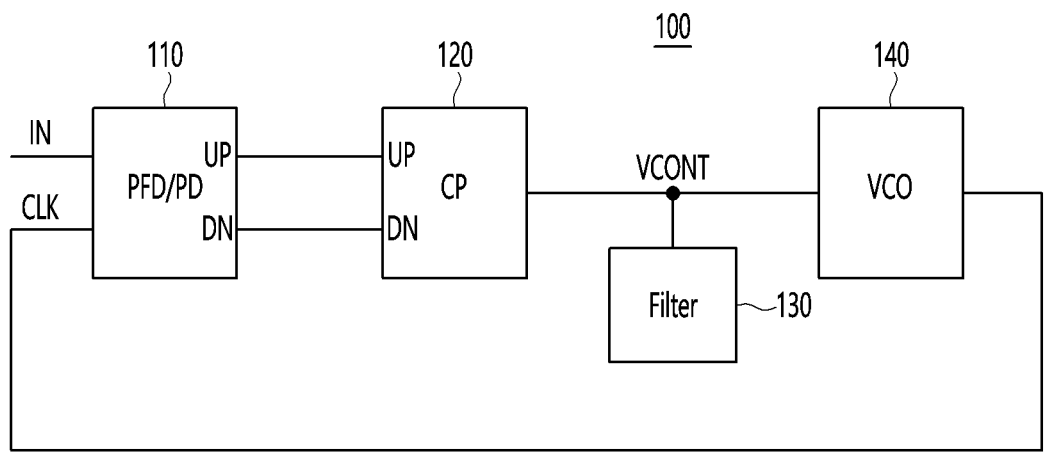
FIG. 1 is a block diagram showing a phase-locked loop circuit according to a first embodiment.

Hereinafter, some embodiments of the present invention will be described in detail through exemplary drawings. When adding reference numerals to components in each drawing, it should be noted that identical components are given the same reference numerals as much as possible even if they are shown in different drawings. Additionally, in describing the present invention, if it is determined that a detailed description of a related known configuration or function can obscure the gist of the present invention, the detailed description will be omitted.

Additionally, when describing the components of the present invention, terms such as first, second, A, B, (a), and (b) can be used. These terms are only used to distinguish the component from other components, and the nature, sequence, or order of the component is not limited by the term. It should be understood that when a component is described as being "connected," "coupled," or "linked" to another component, the component can be directly connected or connected to the other component, but another component can be "connected," "coupled," or "linked" between each component.

FIG. 1 is a block diagram showing a phase-locked loop circuit according to a first embodiment.

Referring to FIG. 1, the phase locked loop (PLL) circuit 100 according to the first embodiment can comprise a phase detector (PD) 110, a filter 130, and a voltage-controlled oscillator (VCO) 140. The PLL 100 according to the first embodiment can further comprise a charge pump (CP) 120. If the PD 110 comprises a frequency detection function, it can be referred to as a phase frequency detector PFD. The filter 130 can comprise a loop filter.

The PD 110 can receive an input signal IN and a clock signal CLK, respectively. The PD 110 can compare the input signal IN and the phases of the clock signal CLK and output a voltage signal according to the result of the phase comparison. As shown in FIG. 1, the clock signal CLK can be a signal fed back from the output signal of the VCO 140, and can correspond to the output signal of the VCO 140 or a signal obtained by dividing the output signal of the VCO 140 by an integer multiple. For example, the PD 110 can output a voltage signal proportional to the phase difference or frequency difference between the input signal IN and the clock signal CLK, but is not limited to thereto. The PD 110 can output a rising signal UP or a falling signal DN based on the phase difference or frequency difference between the input signal IN and the clock signal CLK. A capacitor included in the filter 130 can be charged or discharged according to the rising signal UP or the falling signal DN output from the PD 110.

The charge pump 120 can charge or discharge the filter 130 by controlling the flow of control current based on the rising signal UP or the falling signal DN output from the PD 110. For example, when the charge pump 120 receives the rising signal UP from the PD 110, the charge pump 120 can charge the capacitor of the filter 130. On the other hand, when the charge pump 120 receives the falling signal DN from the PD 110, the charge pump 120 can discharge the capacitor of the filter 130.

As the capacitor of the filter 130 is charged or discharged, the size of the voltage applied to the filter (hereinafter referred to as 'control voltage VCONT' for convenience of explanation) can change.

The VCO 140 can receive a control voltage VCONT and generate an output signal with a frequency corresponding to the input control voltage VCONT. For example, the VCO 140 can adjust the frequency of the signal output from the VCO 140 by adjusting the size of the control voltage VCONT.

Figure 2:
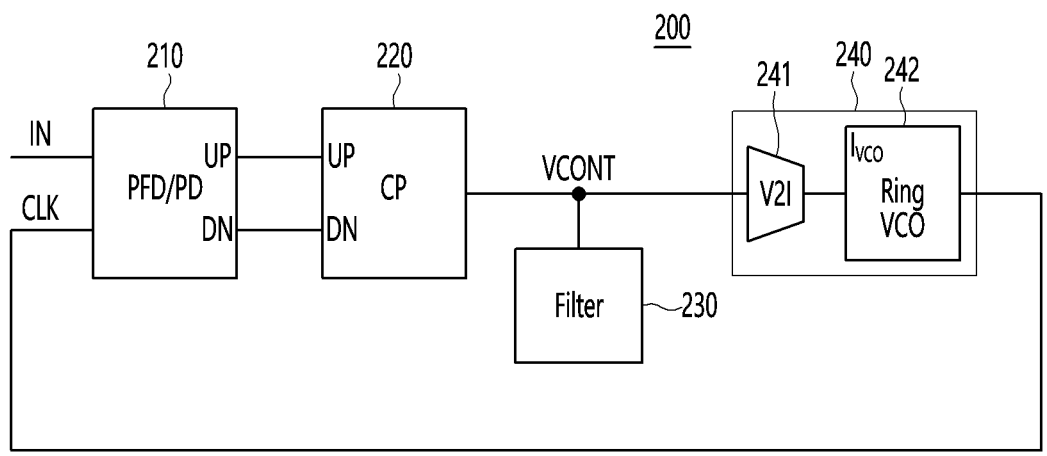
FIG. 2 is a block diagram showing a phase-locked loop circuit according to a second embodiment.

FIG. 2 is a block diagram showing a phase-locked loop circuit according to a second embodiment.

Referring to FIG. 2, the phase locked loop (PLL) circuit 200 according to the second embodiment can comprise a phase detector (PD) 210, a filter 230, and a voltage-controlled oscillator (VCO) 240. The PLL 200 according to the embodiment can further comprise a charge pump (CP) 220. If the PD 210 comprises a frequency detection function, it can be referred to as a phase frequency detector PFD. The filter 230 can comprise a loop filter. Since the PD 210, charge pump 220, and filter 230 shown in FIG. 2 perform the same or similar functions as the PD 110, charge pump 120, and filter 130 described in FIG. 1, respectively, detailed description will be omitted.

The VCO 240 included in the PLL 200 can be implemented as a ring oscillator (or ring VCO 242). As shown in FIG. 2, when the VCO 240 is implemented as a ring VCO 242, the frequency of the output signal can be adjusted based on the input current $I_{VCO}$. To this end, a voltage-current conversion circuit (V2I) 241 capable of converting the control voltage VCONT into the control current $I_{VCO}$ can be added to the front of the ring VCO 242. For example, the V2I 241 and the ring VCO 242 can be understood as components included in the VCO 240.

Hereinafter, with reference to FIGS. 3 to 10, embodiments of the V2I 241 included in the PLL 200 or the VCO 240 will be described. However, the V2I 241, which will be described later, may not be included in the PLL 200 or the VCO 240 but can be included in other components.

Figure 3:
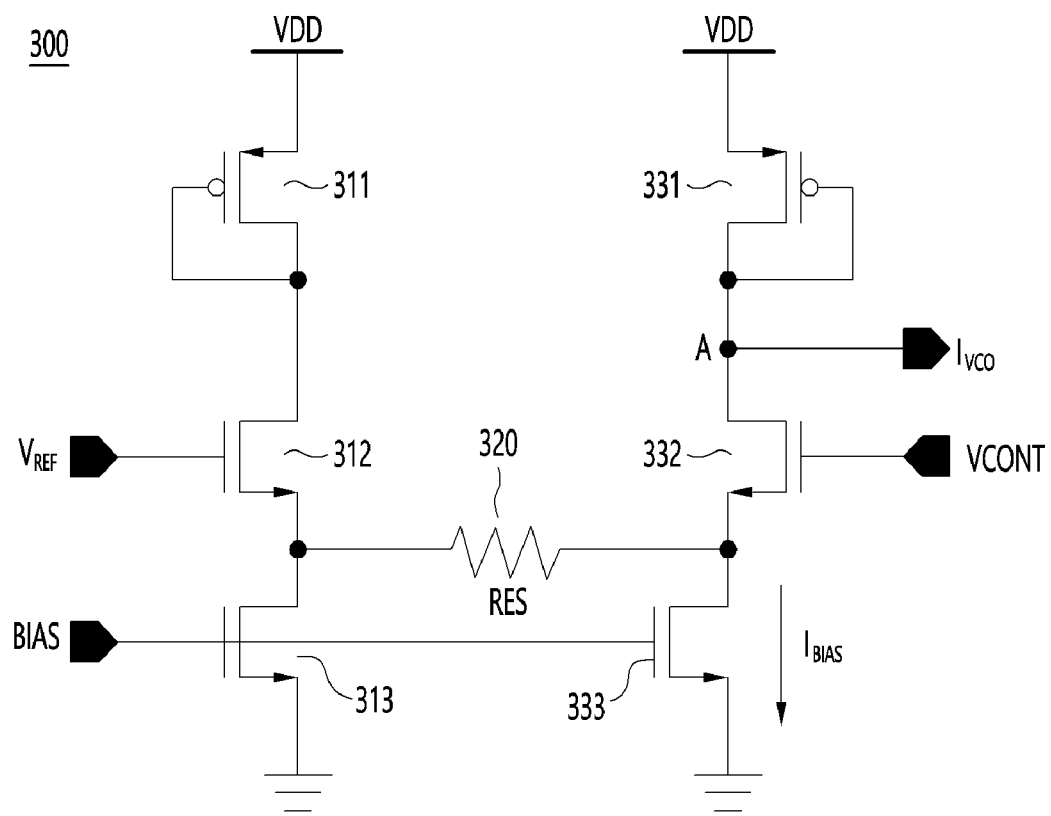
FIG. 3 is a diagram showing a voltage-current conversion circuit according to a first embodiment.

FIG. 3 is a diagram showing a voltage-current conversion circuit according to a first embodiment.

Referring to FIGS. 2 and 3, the voltage-current conversion circuit 300 according to the first embodiment can comprise a first transistor 311, a second transistor 312, a third transistor 313, and a fourth transistor 331, a fifth transistor 332, a sixth transistor 333, and a resistor (RES) 320. The first transistor 311 and the fourth transistor 331 can be PMOS transistors, but are not limited thereto. The second transistor 312, third transistor 313, fifth transistor 332, and sixth transistor 333 can be NMOS transistors, but are not limited thereto. The voltage-current conversion circuit 300 according to the first embodiment can be the V2I 241 shown in FIG. 2. The voltage-current conversion circuit 300 shown in FIG. 3 can be referred to as a differential structure, but is not limited to this term.

One terminal (e.g., source terminal) of the first transistor 311 can be connected to a line supplying a power voltage VDD, and the other terminal (e.g., drain terminal) of the first transistor 311 can be connected to one terminal (e.g., a drain terminal) of the second transistor 312. A gate terminal of the first transistor 311 can be connected to the other terminal (e.g., drain terminal) of the first transistor 311, thereby forming a diode-connected load structure.

One terminal (e.g., drain terminal) of the second transistor 312 can be connected to the other terminal (e.g., drain terminal) of the first transistor 311. The other terminal (e.g., source terminal) of the second transistor 312 can be connected to one terminal (e.g., drain terminal) of the third transistor 313. A reference voltage $V_{REF}$ can be input to a gate terminal of the second transistor 312. The reference voltage can be a preset voltage.

One terminal (e.g., drain terminal) of the third transistor 313 can be connected to the other terminal (e.g., source terminal) of the second transistor 312. The other terminal (e.g., source terminal) of the third transistor 313 can be grounded. A bias voltage BIAS can be input to a gate terminal of the third transistor 313.

One terminal (e.g., source terminal) of the fourth transistor 331 can be connected to a line supplying the power voltage VDD, and the other terminal (e.g., drain terminal) of the fourth transistor 331 can be connected to one terminal (e.g., a drain terminal) of the fifth transistor 332. A gate terminal of the fourth transistor 331 can be connected to the other terminal (e.g., drain terminal) of the fourth transistor 331, thereby forming a diode-connected load structure.

One terminal (e.g., drain terminal) of the fifth transistor 332 can be connected to the other terminal (e.g., drain terminal) of the fourth transistor 331. The other terminal (e.g., source terminal) of the fifth transistor 332 can be connected to one terminal (e.g., drain terminal) of the sixth transistor 333. A control voltage VCONT can be input to a gate terminal of the fifth transistor 332.

One terminal (e.g., drain terminal) of the sixth transistor 333 can be connected to the other terminal (e.g., source terminal) of the fifth transistor 332. The other terminal (e.g., source terminal) of the sixth transistor 333 can be grounded. A bias voltage BIAS can be input to a gate terminal of the sixth transistor 333.

The other terminal (e.g., source terminal) of the second transistor 312 can be connected to the other terminal (e.g., source terminal) of the fifth transistor 332. As shown in FIG. 3, the RES 320 can be connected between the other terminal (e.g., source terminal) of the second transistor 312 and the other terminal (e.g., source terminal) of the fifth transistor 332, which are connected to each other.

The third transistor 313 can be a current source, and a bias current $I_{BIAS}$ can flow between the drain terminal and the source terminal thereof. Additionally, the sixth transistor 333 can be a current source, and a bias current $I_{BIAS}$ can flow between the drain terminal and the source terminal thereof.

The fifth transistor 332 can serve as an input transistor through which the control voltage VCONT is input. Depending on the size of the control voltage VCONT input to the gate terminal of the fifth transistor 332, the size of the control current $I_{VCO}$ flowing through node A between the fourth transistor 331 and the fifth transistor 332 and the line connected to the ring oscillator 242 can be controlled. Accordingly, the voltage-current conversion circuit 300 can perform the function of converting and outputting the input control voltage VCONT into a control current $I_{VCO}$. The control current $I_{VCO}$ flowing to the ring oscillator 242 through the node A can be determined according to a comparison result between the control voltage VCONT input to the gate terminal of the fifth transistor 332 and the reference voltage $V_{REF}$ input to the gate terminal of the second transistor 312. For example, when the control voltage VCONT is high compared to the reference voltage $V_{REF}$, the control current $I_{VCO}$ can increase. As the control current $I_{VCO}$ increases, the frequency of the signal output from the ring oscillator 242 can increase. On the other hand, when the control voltage VCONT is low compared to the reference voltage $V_{REF}$, the control current $I_{VCO}$ can decrease. As the control current $I_{VCO}$ decreases, the frequency of the signal output from the ring oscillator 242 can decrease.

Figure 5:
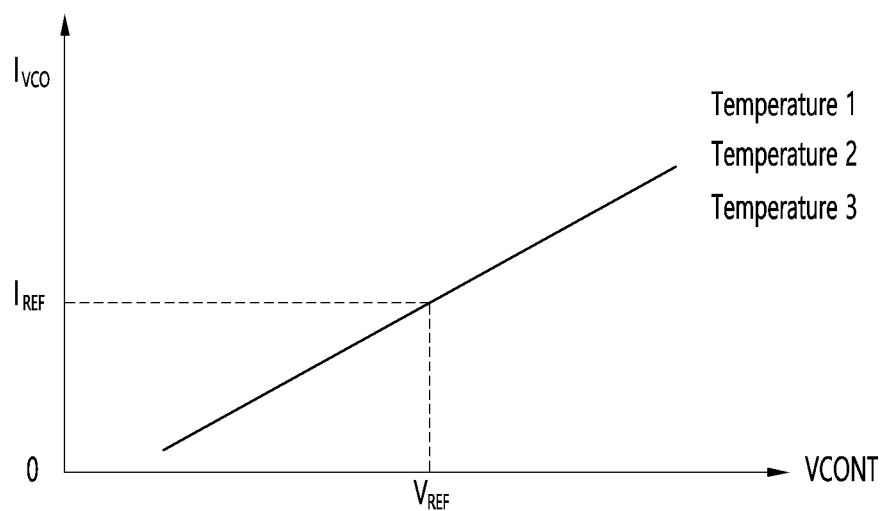
FIG. 5 is a graph showing the relationship between the control voltage and the control current according to a first embodiment.

FIG. 5 is a graph showing the relationship between the control voltage and the control current according to a first embodiment.

When implementing the voltage-current conversion circuit 300 as shown in FIG. 3, as shown in FIG. 5, assuming that the bias current $I_{BIAS}$ and the resistance value of the RES 320 are constant, it can have characteristics that are independent of temperature changes. For example, it can be seen that the same characteristics are all exhibited at a first temperature (e.g., high temperature, Temperature 1), a second temperature (e.g., medium temperature, Temperature 2), and a third temperature (e.g., low temperature, Temperature 3). That is, at the first temperature Temperature 1 to the third temperature Temperature 3, the control voltage VCONT and the control current $I_{VCO}$ can have the same proportional relationship. Meanwhile, the voltage current conversion circuit 300 has the disadvantage of being difficult to use at low supply power because it requires a drain-source voltage so that the third transistor 313 and the sixth transistor 333, which are current sources, can operate in the saturation region.

Figure 4:
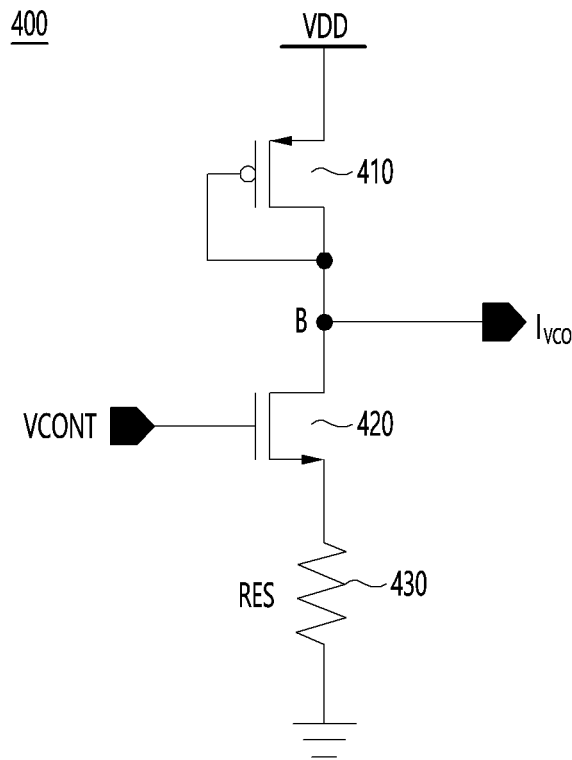
FIG. 4 is a diagram showing a voltage-current conversion circuit according to a second embodiment.

FIG. 4 is a diagram showing a voltage-current conversion circuit according to a second embodiment.

Referring to FIGS. 2 and 4, the voltage-current conversion circuit 400 according to the second embodiment can comprise a first transistor 410, a second transistor 420, and a resistor (RES) 430. The first transistor 410 can be a PMOS transistor, but is not limited thereto. The second transistor 420 can be an NMOS transistor, but is not limited thereto. The voltage-current conversion circuit 400 according to the second embodiment can be the V2I 241 shown in FIG. 2. The voltage-current conversion circuit 400 shown in FIG. 4 can be referred to as a single structure, but is not limited to this term.

One terminal (e.g., source terminal) of the first transistor 410 can be connected to a line that supplies a power voltage VDD, and the other terminal (e.g., drain terminal) can be connected to one terminal (e.g., a drain terminal) of the second transistor 420. A gate terminal of the first transistor 410 can be connected to the other terminal (e.g., drain terminal) of the first transistor 410, thereby forming a diode-connected load structure.

One terminal (e.g., drain terminal) of the second transistor 420 can be connected to the other terminal (e.g., drain terminal) of the first transistor 410. The other terminal (e.g., source terminal) of the second transistor 420 can be connected to one terminal of the RES 430. A control voltage VCONT can be input to a gate terminal of the second transistor 420. The other terminal of the RES 430 can be grounded.

The second transistor 420 can serve as an input transistor through which the control voltage VCONT is input. Depending on the size of the control voltage VCONT input to the gate terminal of the second transistor 420, the size of the control current $I_{VCO}$ flowing through node B between the first transistor 410 and the second transistor 420 and the line connected to the ring oscillator 242 can be controlled. Accordingly, the voltage-current conversion circuit 400 can perform the function of converting and outputting the input control voltage VCONT into a control current $I_{VCO}$. For example, when increasing the control voltage VCONT, the control current $I_{VCO}$ can increase. As the control current $I_{VCO}$ increases, the frequency of the signal output from the ring oscillator 242 can increase. On the other hand, when the control voltage VCONT is reduced, the control current $I_{VCO}$ can decrease. As the control current $I_{VCO}$ decreases, the frequency of the signal output from the ring oscillator 242 can decrease.

Referring to FIG. 4, compared to FIG. 3, because there is no current source (the third transistor 313 and the sixth transistor 333 in FIG. 3), the single-structure voltage-current conversion circuit 400 can be used even with low supply power. However, when the temperature changes, the threshold voltage of the second transistor 420, which serves as an input transistor, changes. Accordingly, the operating range can change as shown in FIG. 6.

Figure 6:
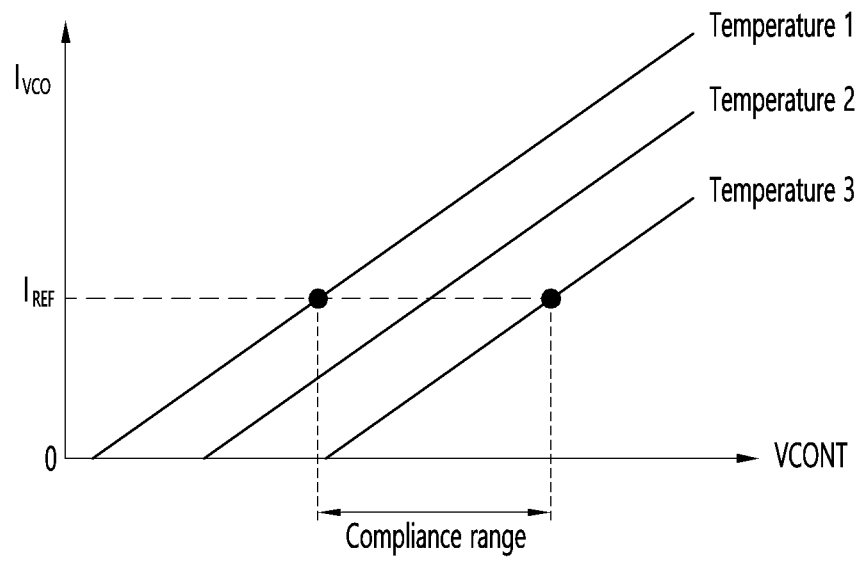
FIG. 6 is a graph showing the relationship between the control voltage and the control current according to a second embodiment.

FIG. 6 is a graph showing the relationship between the control voltage and the control current according to a second embodiment.

When implementing the voltage-current conversion circuit 400 according to the second embodiment as shown in FIG. 4, as shown in FIG. 6, it can be seen that the control current $I_{VCO}$ output in response to the control voltage VCONT changes depending on the temperature change. For example, in order to output a specific reference current $I_{REF}$, there is a disadvantage that different input voltages VCONT must be supplied to the voltage-current conversion circuit 400 according to the second embodiment according to each of the different first temperatures Temperature 1, the second temperatures Temperature 2, and the third temperatures Temperature 3.

Hereinafter, with reference to FIGS. 7 to 10, a voltage-current conversion circuit that can operate even with a relatively low supply power and has stable characteristics even when temperature changes will be described.

Figure 7:
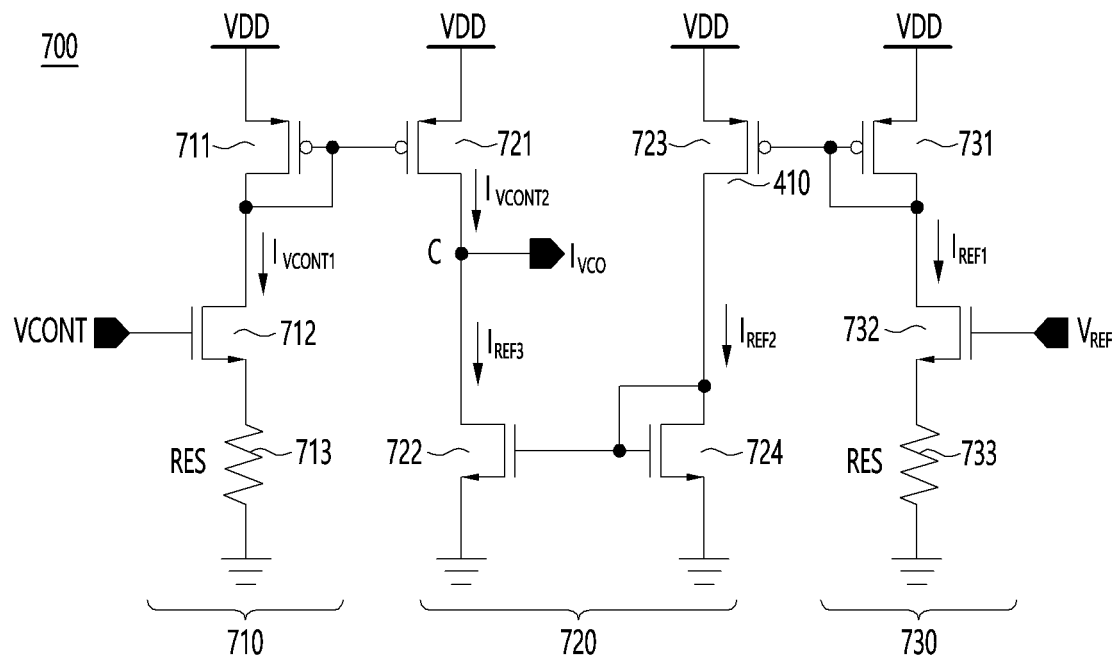
FIG. 7 is a diagram showing a voltage-current conversion circuit according to a third embodiment.

FIG. 7 is a diagram showing a voltage-current conversion circuit according to a third embodiment.

Referring to FIGS. 2 and 7, the voltage-current conversion circuit 700 according to the third embodiment can comprise a first conversion circuit 710 (e.g., first circuit) and a second conversion circuit 730 (e.g., a second circuit), and a subtraction circuit 720 (e.g., a third circuit). The first conversion circuit 710 can be configured in the same or similar form as the structure described above in FIG. 4 and can be referred to as a single structure circuit, but is not limited to this term. The second conversion circuit 730 can be configured in the same or similar form as the first conversion circuit 710 and can be referred to as a replica circuit, but is not limited to this term.

The first conversion circuit 710 can comprise a first transistor 711, a second transistor 712, and a first resistor (RES) 713. The first transistor 711 can be a PMOS transistor, but is not limited thereto. The second transistor 712 can be an NMOS transistor, but is not limited thereto.

One terminal (e.g., source terminal) of the first transistor 711 can be connected to a line that supplies a power voltage VDD, and the other terminal (e.g., drain terminal) can be connected to one terminal (e.g., a drain terminal) of the second transistor 712. A gate terminal of the first transistor 711 can be connected to the other terminal (e.g., drain terminal) of the first transistor 711, thereby forming a diode-connected load structure.

One terminal (e.g., drain terminal) of the second transistor 712 can be connected to the other terminal (e.g., drain terminal) of the first transistor 711. The other terminal (e.g., source terminal) of the second transistor 712 can be connected to one terminal of the first resistor 713.

A control voltage VCONT can be input to a gate terminal of the second transistor 712. The other terminal of the first resistor 713 can be grounded.

The second transistor 712 can serve as an input transistor through which the control voltage VCONT is input. The size of the current $I_{VCONT1}$ (e.g., first current) flowing between the first transistor 711 and the second transistor 712 can be controlled according to the size of the control voltage VCONT input to the gate terminal of the second transistor 712.

The second conversion circuit 730 can comprise a seventh transistor 731, an eighth transistor 732, and a second resistor (RES) 733. The seventh transistor 731 can be a PMOS transistor, but is not limited thereto. The eighth transistor 732 can be an NMOS transistor, but is not limited thereto.

One terminal (e.g., source terminal) of the seventh transistor 731 can be connected to a line that supplies a power supply voltage VDD, and the other terminal (e.g., drain terminal) can be connected to one terminal (e.g., drain terminal) of the eighth transistor 732. A gate terminal of the seventh transistor 731 can be connected to the other terminal (e.g., drain terminal) of the seventh transistor 731, thereby forming a diode-connected load structure.

One terminal (e.g., drain terminal) of the eighth transistor 732 can be connected to the other terminal (e.g., drain terminal) of the seventh transistor 731. The other terminal (e.g., source terminal) of the eighth transistor 732 can be connected to one terminal of the second resistor 733. A reference voltage $V_{REF}$ can be input to a gate terminal of the eighth transistor 732. The other terminal of the second resistor 733 can be grounded.

The eighth transistor 732 can serve as an input transistor through which the reference voltage $V_{REF}$ is input. The size of the current $I_{REF1}$ (e.g., second current) flowing between the seventh transistor 731 and the eighth transistor 732 can be controlled according to the size of the reference voltage $V_{REF}$ input to the gate terminal of the eighth transistor 732.

The subtraction circuit 720 can comprise a third transistor 721, a fourth transistor 722, a fifth transistor 723, and a sixth transistor 724. The third transistor 721 and the fifth transistor 723 can be PMOS transistors, but are not limited thereto. The fourth transistor 722 and the sixth transistor 724 can be NMOS transistors, but are not limited thereto.

One terminal (e.g., source terminal) of the third transistor 721 can be connected to a line supplying a power voltage VDD, and the other terminal (e.g., drain terminal) can be connected to one terminal (e.g., a drain terminal) of the fourth transistor 722.

One terminal (e.g., drain terminal) of the fourth transistor 722 can be connected to the other terminal (e.g., drain terminal) of the third transistor 721. The other terminal (e.g., source terminal) of the fourth transistor 722 can be grounded.

One terminal (e.g., source terminal) of the fifth transistor 723 can be connected to a line that supplies a power voltage VDD, and the other terminal (e.g., drain terminal) can be connected to one terminal (e.g., a drain terminal) of the sixth transistor 724.

One terminal (e.g., drain terminal) of the sixth transistor 724 can be connected to the other terminal (e.g., drain terminal) of the fifth transistor 723. The other terminal (e.g., source terminal) of the sixth transistor 724 can be grounded. A gate terminal of the sixth transistor 724 can be connected to one terminal (e.g., drain terminal) of the sixth transistor 724, thereby forming a diode-connected load structure.

The gate terminal of the first transistor 711 included in the first conversion circuit 710 and the gate terminal of the third transistor 721 included in the subtraction circuit 720 can be connected to each other to form a current mirror circuit. Accordingly, the current $I_{VCONT2}$ flowing between the third transistor 721 of the subtraction circuit 720 and node C can be determined based on the current $I_{VCONT1}$ (e.g., first current) flowing between the first transistor 711 and the second transistor 712 of the first conversion circuit 710. For example, the current $I_{VCONT2}$ can be equal to or proportional to the current $I_{VCONT1}$.

The gate terminal of the seventh transistor 731 included in the second conversion circuit 730 and the gate terminal of the fifth transistor 723 included in the subtraction circuit 720 can be connected to each other to form a current mirror circuit. Accordingly, the current $I_{REF2}$ flowing between the fifth transistor 723 and the sixth transistor 724 of the subtraction circuit 720 can be first determined based on the current $I_{REF1}$ (e.g., second current) flowing between the seventh transistor 731 and the eighth transistor 732 of the second conversion circuit 730. For example, the current $I_{REF2}$ can be equal to or proportional to the current $I_{REF1}$.

Within the subtraction circuit 720, the gate terminal of the fourth transistor 722 and the gate terminal of the sixth transistor 724 can be connected to each other, thereby forming a current mirror circuit. Accordingly, within the subtraction circuit 720, the current $I_{REF3}$ flowing between the node C and the fourth transistor 722 can be determined based on the current $I_{REF2}$ flowing between the fifth transistor 723 and the sixth transistor 724. For example, the current $I_{REF3}$ can be equal to or proportional to the current $I_{REF2}$. Accordingly, within the subtraction circuit 720, the current $I_{REF3}$ flowing between node C and the fourth transistor 722 can be determined based on the current $I_{REF1}$ (e.g., second current) flowing between the seventh transistor 731 and the eighth transistor 732 of the second conversion circuit 730. Since the current $I_{REF3}$ is equal to or proportional to the current $I_{REF1}$, it can be referred to as the replica current $I_{Replica}$, but is not limited to this term.

The second transistor 712 can serve as an input transistor through which the control voltage VCONT is input. The size of the current $I_{VCONT2}$ flowing between the third transistor 721 and the node C can be controlled according to the size of the control voltage VCONT input to the gate terminal of the second transistor 712. Additionally, the eighth transistor 732 can serve as an input transistor through which the reference voltage $V_{REF}$ is input. The size of the current $I_{REF3}$ flowing between the node C and the fourth transistor 722 can be controlled according to the size of the reference voltage $V_{REF}$ input to the gate terminal of the eighth transistor 732.

The ring oscillator 242 can be connected to through the node C between the third transistor 721 and the fourth transistor 722. The size of the control current $I_{VCO}$ flowing through the line connected to the ring oscillator 242 at the node C can correspond to the difference between the current $I_{VCONT2}$ and the current $I_{REF3}$. Assuming that the reference voltage $V_{REF}$ is a constant value (e.g., VDD/2), the current $I_{REF3}$ can also have a constant value. Accordingly, the size of the control current $I_{VCO}$ flowing through the line connected to the ring oscillator 242 at the node C can vary depending on the size of the current $I_{VCONT2}$. The size of the current $I_{VCONT2}$ can be adjusted by the input voltage VCONT input to the gate terminal of the second transistor 712. Accordingly, the size of the control current $I_{VCO}$ flowing through the line connected to the ring oscillator 242 at the node C can be adjusted by the input voltage VCONT input to the gate terminal of the second transistor 712. Therefore, the voltage-current conversion circuit 700 according to the third embodiment can perform the function of converting and outputting the input control voltage VCONT into control current $I_{VCO}$. For example, when increasing the control voltage VCONT, the control current $I_{VCO}$ can increase. As the control current $I_{VCO}$ increases, the frequency of the signal output from the ring oscillator 242 can increase. On the other hand, when the control voltage VCONT is reduced, the control current $I_{VCO}$ can decrease. As the control current $I_{VCO}$ decreases, the frequency of the signal output from the ring oscillator 242 can decrease.

When constructing the voltage-current conversion circuit 700 according to the third embodiment, it can have the same characteristics even if the temperature changes as in the voltage-current conversion circuit 300 having a single structure according to the first embodiment. In addition, when constructing the voltage-current conversion circuit 700 according to the third embodiment, as in the voltage-current conversion circuit 400 with a differential structure according to the second embodiment, there is no current source (the third transistor 313 and the sixth transistor 333 in FIG. 3), so that it can operate even in a relatively small output range.

For example, as shown in FIG. 7, since the second conversion circuit 730 constituting the replica circuit has the same or similar structure as the first conversion circuit 710, even if the temperature changes, the control current $I_{VCO}$ obtained by subtracting the second current $I_{REF1}$ from the first current $I_{VCONT1}$ can be output, so that characteristics can be offset by temperature changes.

Figure 8:
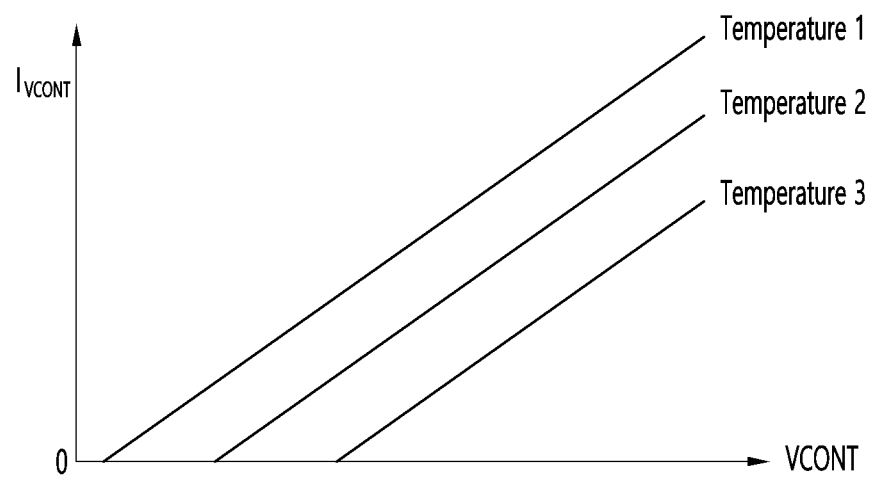
FIG. 8 is a graph showing an example of the relationship between the control voltage and the control current according to a third embodiment.

FIG. 8 is a graph showing an example of the relationship between the control voltage and the control current according to an embodiment.

Referring to FIG. 8, as shown in FIG. 7, as the input voltage VCONT increases or decreases, the current (e.g., $I_{VCONT1}$) can increase or decrease. Meanwhile, when the temperature changes, the threshold voltage of the second transistor 712, which serves as an input transistor, changes, which can cause the operating range to change as shown in FIG. 8.

Figure 9:
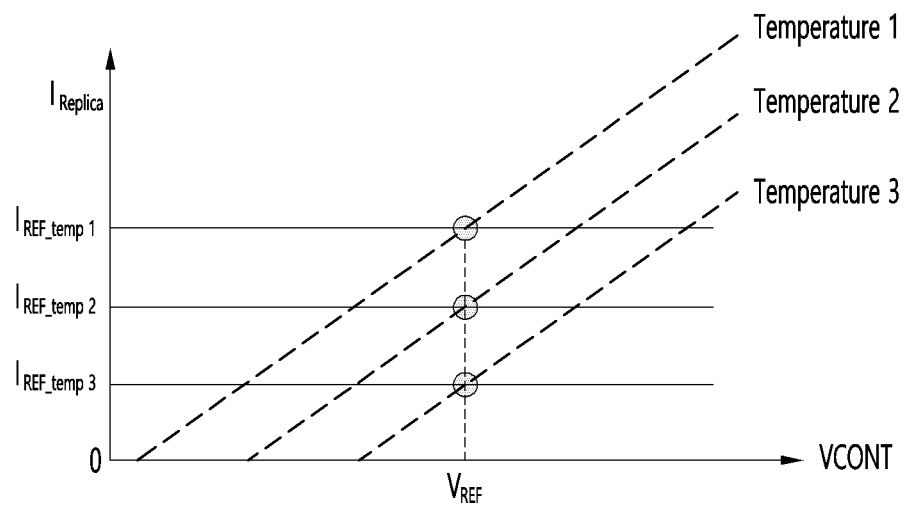
FIG. 9 is a graph showing another example of the relationship between the control voltage and the control current according to an embodiment.

FIG. 9 is a graph showing another example of the relationship between the control voltage and the control current according to an embodiment.

Referring to FIG. 9, as shown in FIG. 7, as the reference voltage $V_{REF}$ is input, a current (e.g., a second current $I_{REF1}$) can be generated. Meanwhile, when the temperature changes, the threshold voltage of the eighth transistor 732, which serves as an input transistor, can change. Accordingly, as shown in FIG. 9, even if the same reference voltage $V_{REF}$ is input, the size of the current (e.g., the second current $I_{REF1}$) can vary. For example, even if the same reference voltage $V_{REF}$ is input, the size of the current (e.g., the second current $I_{REF1}$) can be different as the current $I_{REF\_temp1}$, the current $I_{REF\_temp2}$, and the current $I_{REF\_temp3}$ according to the first temperature Temperature 1, the second temperature Temperature 2 and the third temperature Temperature 3.

Figure 10:
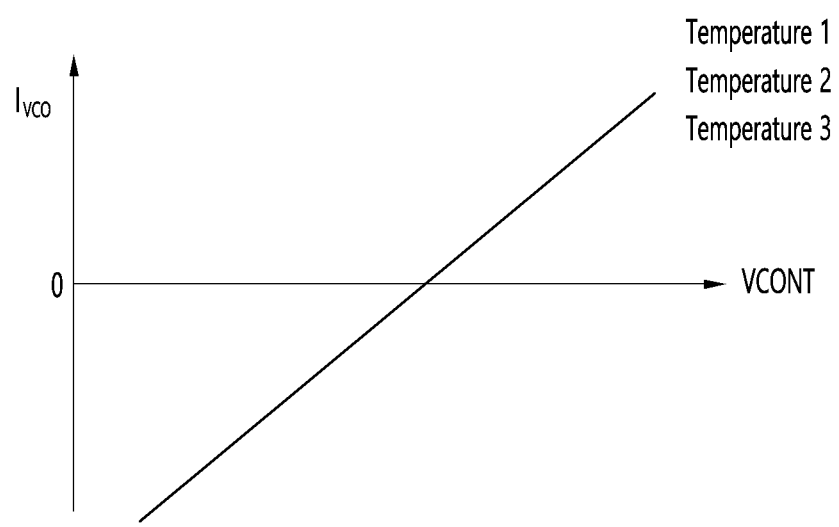
FIG. 10 is a graph showing another example of the relationship between the control voltage and the control current according to an embodiment.

FIG. 10 is a graph showing another example of the relationship between the control voltage and the control current according to an embodiment.

Referring to FIG. 10, as shown in FIGS. 2 and 7, the size of the control current $I_{VCO}$ flowing through the line connected to the ring oscillator 242 at node C can be generated by the difference between the first current $I_{VCONT1}$ shown in FIG. 7 and the second current $I_{REF1}$ shown in FIG. 9, so that effects according to temperature can be offset. Accordingly, the control current $I_{VCO}$ can have a proportional relationship to the control voltage VCONT regardless of changes in temperature.

As described above, according to the embodiment, by using a voltage-current conversion circuit, a voltage-controlled oscillator with temperature-insensitive characteristics can be designed at relatively low supply power.

In addition, according to the embodiment, since the voltage-current conversion circuit has a current output through a replica circuit, it is suitable for implementing a current mirror and can have high scalability. Accordingly, the voltage-current conversion circuit can be easily configured as a multi-lane circuit.

What is claimed is:

1. A voltage-controlled oscillator, comprising:
a voltage-current conversion circuit configured to receive a control voltage and output a control current corresponding to the control voltage; and
a ring oscillator configured to output an output signal with a frequency corresponding to the control current,
wherein the voltage-current conversion circuit comprises:
a first circuit configured to output a first current corresponding to the control voltage;
a second circuit configured to output a second current corresponding to a reference voltage; and
a third circuit configured to output the control current based on the first current and the second current,
wherein the second circuit is a replica circuit of the first circuit, and
wherein the third circuit is configured to form a current mirror with the second circuit to output a third current corresponding to the second current, and the third circuit is configured to output the control current based on the first current and the third current.

2. The voltage-controlled oscillator of claim 1, wherein the control current is generated based on a difference between the first current and the third current.

3. The voltage-controlled oscillator of claim 2, wherein the reference voltage is a preset voltage.

4. The voltage-controlled oscillator of claim 1, wherein the first circuit comprises a first NMOS transistor having a gate terminal through which the control voltage is input, and
the second circuit comprises a second NMOS transistor having a gate terminal through which the reference voltage is input.

5. The voltage-controlled oscillator of claim 4, wherein the first NMOS transistor and the second NMOS transistor have the same temperature characteristics.

6. A voltage-current conversion circuit, comprising:
a first circuit configured to receive a control voltage and output a first current corresponding to the control voltage;
a second circuit configured to receive a reference voltage and output a second current corresponding to the reference voltage; and
a third circuit configured to output a control current corresponding to the control voltage based on the first current and the second current,
wherein the second circuit is a replica circuit of the first circuit, and
wherein the third circuit is configured to form a current mirror with the second circuit to output a third current corresponding to the second current, and the third circuit is configured to output the control current based on the first current and the third current.

7. The voltage-current conversion circuit of claim 6, wherein the control current is generated based on a difference between the first current and the third current.

8. The voltage-current conversion circuit of claim 7, wherein the reference voltage is a preset voltage.

9. The voltage-current conversion circuit of claim 6, wherein the first circuit comprises a first NMOS transistor having a gate terminal through which the control voltage is input, and
the second circuit comprises a second NMOS transistor having a gate terminal through which the reference voltage is input.

10. The voltage-current conversion circuit of claim 9, wherein the first NMOS transistor and the second NMOS transistor have the same temperature characteristics.

11. A phase-locked loop circuit, comprising:
a phase detector configured to detect a phase difference between a first input signal and a second input signal;
a filter configured to charge or discharge based on the phase difference;

a voltage-current conversion circuit configured to output a control current corresponding to a control voltage applied to the filter; and an oscillator configured to output an output signal with a frequency corresponding to the control current, wherein the voltage-current conversion circuit comprises:
a first circuit configured to output a first current corresponding to the control voltage;
a second circuit configured to output a second current corresponding to a reference voltage; and
a third circuit configured to output the control current based on the first current and the second current, wherein the second circuit is a replica circuit of the first circuit, and wherein the third circuit is configured to form a current mirror with the second circuit to out-put a third current corresponding to the second current, and the third circuit is configured to output the control current based on the first current and the third current.

12. The phase-locked loop circuit of claim 11, wherein the control current is generated based on a difference between the first current and the third current.

13. The phase-locked loop circuit of claim 11, wherein the second input signal corresponds to the output signal of the oscillator.

14. The phase-locked loop circuit of claim 11, wherein the oscillator comprises a ring oscillator.

* * * * *